US008917091B2

(12) United States Patent
Le Prado et al.

(10) Patent No.: US 8,917,091 B2
(45) Date of Patent: Dec. 23, 2014

(54) METHOD OF CALIBRATING AN ATOMIC-FUNCTIONING APPARATUS

(75) Inventors: Matthieu Le Prado, Charmes sur l'Herbasse (FR); Jean-Michel Leger, Villard Bonnot (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 420 days.

(21) Appl. No.: 13/226,086

(22) Filed: Sep. 6, 2011

(65) Prior Publication Data

US 2012/0062221 A1    Mar. 15, 2012

(30) Foreign Application Priority Data

Sep. 7, 2010 (FR) ...................................... 10 57085

(51) Int. Cl.
*G01R 31/02* (2006.01)
*G01C 19/62* (2006.01)
*G04F 5/14* (2006.01)
*G01R 33/26* (2006.01)
*G01C 25/00* (2006.01)

(52) U.S. Cl.
CPC *G04F 5/14* (2013.01); *G01C 19/62* (2013.01); *G01R 33/26* (2013.01); *G01C 25/005* (2013.01)
USPC ........................................................ 324/244

(58) Field of Classification Search
USPC .............................. 324/202, 244–248; 702/85
See application file for complete search history.

(56) References Cited

U.S. PATENT DOCUMENTS

| | | | |
|---|---|---|---|
| 3,284,699 A | 11/1966 | Malnar | |
| 3,629,697 A * | 12/1971 | Bouchiat et al. | 324/301 |
| 5,245,280 A | 9/1993 | Beranger et al. | |
| 6,046,810 A * | 4/2000 | Sanders et al. | 356/459 |
| 6,313,628 B1 | 11/2001 | Leger | |
| 2005/0212607 A1* | 9/2005 | Happer et al. | 331/94.1 |
| 2007/0121117 A1* | 5/2007 | Chen | 356/460 |
| 2007/0229838 A1* | 10/2007 | Greening et al. | 356/460 |
| 2009/0243610 A1* | 10/2009 | Ichihara et al. | 324/301 |
| 2010/0244970 A1 | 9/2010 | Le Prado et al. | |
| 2010/0315173 A1 | 12/2010 | Le Prado et al. | |

FOREIGN PATENT DOCUMENTS

| | | |
|---|---|---|
| EP | 0 462 001 A1 | 12/1991 |
| EP | 0 964 260 A1 | 12/1999 |
| FR | 1 354 208 | 3/1964 |
| FR | 2 924 826 | 6/2009 |
| FR | 2 924 827 | 6/2009 |

OTHER PUBLICATIONS

European Search Report issued Dec. 6, 2011 in patent application No. 11180128.8 with English translation of Category of Cited Documents.

* cited by examiner

*Primary Examiner* — Patrick Assouad
*Assistant Examiner* — Demetrius Pretlow
(74) *Attorney, Agent, or Firm* — Oblon, Spivak, McClelland, Maier & Neustadt, L.L.P.

(57) ABSTRACT

This method makes it possible to carry out the auto-calibration of the electromagnetic coils of an apparatus such as an atomic clock, a magnetometer or a gyroscope by injecting successive currents into the coils and measuring the magnetic fields induced in order to calculate the transfer coefficients (field/current) of each of the coils and the real angles that they form with very great precision.

8 Claims, 1 Drawing Sheet

METHOD OF CALIBRATING AN ATOMIC-FUNCTIONING APPARATUS

Figure 1:
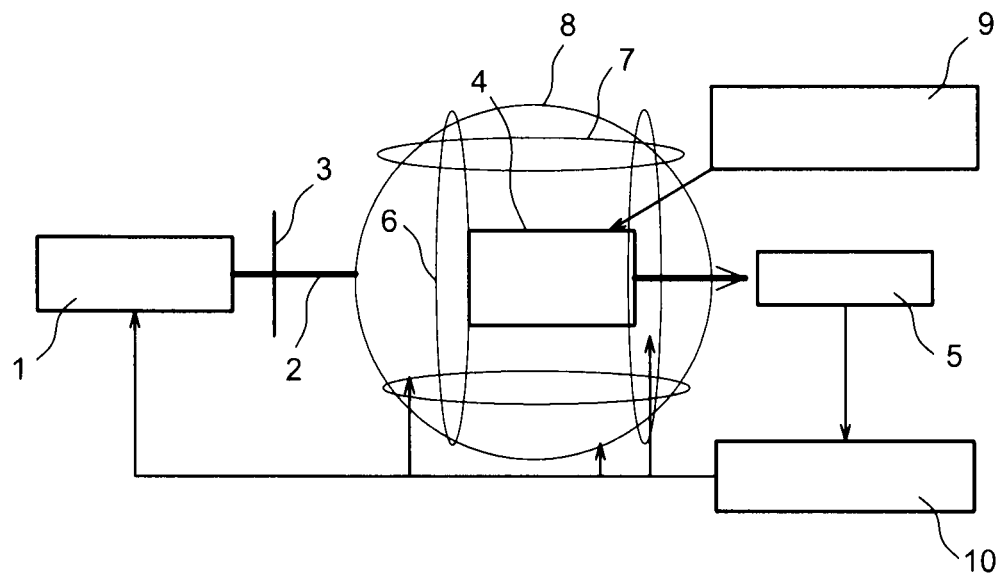

The subject of the invention is a method of calibrating an atomic-functioning apparatus, that is to say one using optical pumping of a light beam, and also comprising electromagnetic coils; it may be an atomic clock, a magnetometer or a gyroscope.

Electromagnetic coils are used in various ways in such apparatus, for making magnetic measurements or producing artificial magnetic fields. Very precise control of the coils is often necessary in order to obtain correct results. Calibration of the coils may encompass the transfer function, that is to say the ratio of the magnetic field that is induced therein as a function of the current passing through them, and the direction of this field with respect to a reference direction.

A calibration method is proposed here in which no additional apparatus is used for calibrating the characteristics of the magnetic fields induced by the coils, which thus carry out auto-calibration.

In a general form, the invention concerns a method of calibrating an apparatus comprising three electromagnetic coils and a light beam subjecting a gaseous medium to optical pumping, the method comprising a determination of gain coefficients of the coils and angles between the coils, characterised in that it comprises:
  a cell filled with a measuring medium;
  an optical beam subjecting the measuring medium to optical pumping;
  three electromagnetic coils each generating a magnetic field axial to the cell;
  the method being characterised in that it comprises the following steps:
    successive injection of at least one current ($i_x$, $i_y$, $i_z$) for each coil;
    measuring the magnetic field generated by each of the coils;
    determining a gain coefficient for each coil (T);
    simultaneous injection of currents in the coils in each pair of coils, including two currents in one of the coils in the pair and at least one current in the other coil in the pair, in accordance with at least two different states of combination of said currents ($i_x$ $i_y$; $-i_x$ $i_y$; $-i_x$ $-i_y$; $i_x$ $-i_y$);
    measuring the magnetic fields generated by said combinations of currents;
    determining at least one angle ($\alpha$, $\theta$, $\gamma$) between the coils.

This general form of the invention is applicable when the ambient magnetic field is disregarded, stopped by shielding or compensated for by the creation of an artificial or opposing field. A method for compensating for the field may comprise the following steps:
  generation of two orthogonal oscillating fields;
  generation of an essentially static magnetic field by each of the coils;
  compensation for the ambient field by said essentially static field by magnetic adjustment generated for each of the coils.

If the field is not negligible, the method preferably comprises a successive injection of two currents for each coil for determining the gain coefficient and a simultaneous injection of currents in the coils in each pair of coils, including two currents in each of the coils in the pair according to four different states of combination of said currents.

Advantageously, the magnetic fields are measured by an application of radio frequencies and a search for resonance of the gaseous medium at a Larmor frequency.

The invention will now be described in the detail of its various aspects in relation to the figures, among which:
  FIG. 1 is general view of the apparatus,
  FIG. 2 is a definition of the angles measured between the coils.

FIG. 1 is an example of implementation of the method of the invention. This FIG. 1 illustrates a vector magnetometer that comprises a laser (1) emitting a beam (2). The beam (2) passes successively through a rectilinear polariser (3) and through a cell (4) filled with helium 4 that it subjects to optical pumping. A photodiode (5) collects the light restored by the content of the cell (4). The device comprises three coils (6, 7 and 8) supplying magnetic fields in three nominally orthogonal axes, a radio-frequency generator (9) and a electronic card (10) for controlling the laser (1) and the current passing through the coils (6, 7 and 8) according to the requirements of the method, for calibration or other reasons (ambient field compensation, creation of stabilisation field etc). Apparatus or methods where the ambient magnetic field is corrected effectively by application of an artificial static magnetic field of suitable intensity and direction are described in the documents FR-A-2 924 826 and 2 924 827, to which reference is made since the teaching thereof can be repeated here. Several currents may pass alternately through each of the coils (6, 7 and 8) at different frequencies. The radio-frequency generator (9) emits electromagnetic waves at the Larmor frequency in the invention, again by means of the coils (6, 7 and 8).

Figure 2:
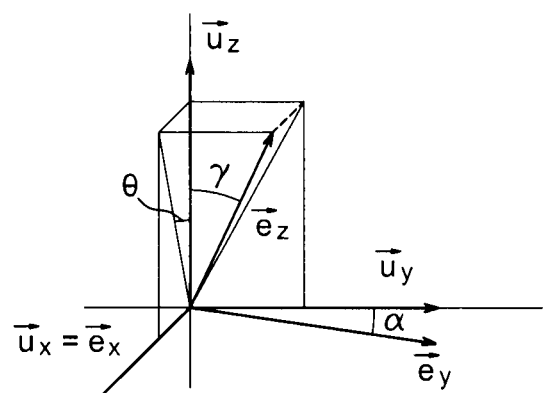

FIG. 2 illustrates the parameters used in the remainder of the disclosure. It is the three angles $\alpha$, $\gamma$, $\theta$ between the axes ($\vec{e}_x$, $\vec{e}_y$, $\vec{e}_z$) of the coils (6, 7, 8) defined with respect to a direct orthonormed reference frame ($\vec{u}_x$, $\vec{u}_y$, $\vec{u}_z$). The relative orientation of the reference frame ($\vec{e}_x$, $\vec{e}_y$, $\vec{e}_z$) of the instrument, defined by the directions of these axes with respect to the orthonormed reference frame, is defined as follows: $\vec{e}_x$ coincides with $\vec{u}_x$, $\vec{e}_y$ is contained in the plane ($\vec{u}_x$, $\vec{u}_z$) and forms an angle $\alpha$ with $\vec{u}$, and the projections of $\vec{e}_z$ on the planes ($\vec{u}_x$, $\vec{u}_z$) and ($\vec{u}_y$, $\vec{u}_z$) form the angles $\gamma$ and $\theta$ with $\vec{u}_z$. The base vectors of the reference frame of the coils ($\vec{e}_x$, $\vec{e}_y$, $\vec{e}_z$) are therefore expressed in the orthonormed reference frame ($\vec{u}_x$, $\vec{u}_y$, $\vec{u}_z$) in accordance with the following equations:

$$\vec{e}_x = \vec{u}_x;$$

$$\vec{e}_y = -\sin\alpha * \vec{u}_x + \cos\alpha * \vec{u}_y;$$

$$\vec{e}_z = \frac{\tan\theta}{\sqrt{1+\tan^2\theta+\tan^2\gamma}} * \vec{u}_x + \frac{\tan\gamma}{\sqrt{1+\tan^2\theta+\tan^2\gamma}} * \vec{u}_y + \frac{\tan 1}{\sqrt{1+\tan^2\theta+\tan^2\gamma}} * \vec{u}_z.$$

The purpose of the calibration procedure is to make it possible to precisely evaluate firstly transfer functions (gain coefficients) between the magnetic field and the current, denoted $T_x$, $T_y$, $T_z$ for the coils (6, 7 and 8) and secondly the differences in orthogonality between the respective directions thereof. To do this, scalar magnetic measurements are generated with the atomic instrument by injecting currents successively in each of the coils (6, 7 and 8) and then simultaneously in several of them. This choice also guarantees that, for each series of measurements, the amplitude of the resonance signals of the light of the beam 2 at the Larmor frequency are sufficient to obtain a signal to noise ratio compatible with the required precision. The choice of the order of magnitude of the scalar fields to be generated stems from the expected precision for the calibration of the coils (6, 7 and 8). By way of example for guaranteeing absolute precision of 0.1 nT in a field the modulus of which may be as much as 5 µT, it is necessary to determine the current transfer functions on magnetic field at better than $2.10^{-5}$ and the orthogonality differences to within a millidegree. It will be assumed hereinafter that the polarisation direction $\vec{e}_0^*$ of the photons in the case of rectilinear polarisation is colinear with $\vec{e}_x$.

The procedure in the example of FIG. 1 will be detailed in the case of the coil (6) of axis $\vec{e}_x$, the determination of the transfer functions of the two other coils (7 and 8) being at every point similar.

The artificial field being created in the direction $\vec{e}_x$, the radio-frequency field by virtue of which a resonance will be induced according to the spin frequency or the Larmor frequency could be applied indifferently in the other two axes $\vec{e}_y$ or $\vec{e}_z$.

A current $i_x$ is injected successively positive and negative in the coil (6) and in each case the resonant frequency F of the magnetometer operating in scalar mode is measured. The modulus of the magnetic field is then equal to $$B \pm i_x = \left| \frac{B}{y} \pm ixTx \right|,$$

where $B_x$ is the component of the local field in the direction of the axis $\vec{e}_x$, ignoring the components of the local field in the perpendicular plane. It should be noted that these components can always be compensated for in advance by virtue of known vector measurement methods, disclosed in particular in the thesis by Gravarand et al "On the calibration of a vectorial 4He pumped magnetometer" which appeared in Earth, Planets and Space, 2001, volume 53, no 10, pages 949 to 958, the state thesis of Dupont-Roc of 1972 "Study of some effects relating to optical pumping in weak field" and the applications FR-A-2 924 826 and 2 924 827 already mentioned. For calibration precision of $10^{-6}$, it is necessary for the transverse magnetic field to be less that $10^{-3}$ times the magnetic field $ixT_x$ generated by the coil concerned.

The following system of equations is derived from this:

$$\begin{cases} B_{+i_x} = B_x + i_x T_x \\ B_{-i_x} = B_x - i_x T_x \end{cases}$$

by virtue of which $T_x$ is determined immediately, $i_x$ being known.

The effects of the fluctuations of the ambient magnetic field during this calibration phase can be attenuated by repeating these alternating measurements on several occasions. Where applicable, a drift of the projection $B_x$ of the ambient field can be estimated in order to improve the precision of the calculations.

As mentioned, the same method is repeated for the other coils (7 and 8).

It is described below how to determine the orthogonality differences of the three coils (6, 7 and 8). As before, sequences of measurements of scalar fields corresponding to artificial fields created by the coils (6, 7 and 8) are proceeded with, using here combinations of pairs of coils chosen so as guarantee a signal amplitude allowing measurement with the required resolution.

For determining the angle α between $\vec{u}_y$ and $\vec{e}_y$, currents are injected into the coils (6 and 7) of axes $\vec{e}_x$ and $\vec{e}_y$, according to the sequence $(+i_x+i_y; -i_x+i_y; -i_x-i_y; +i_x-i_y)$, combining the two current values of each of the active coils according to the four possible states. The currents $i_x$ and $i_y$ are chosen so that the modulus of the field is 70% of the current applied during the phases of calibrating the transfer functions of the coils.

The following system of equations is then obtained:

$$\begin{cases} (B_{ix+iy})^2 - (B_{-ix+iy})^2 = 4i_x T_x (B_x - i_y T_y \sin\alpha) \\ (B_{ix-iy})^2 - (B_{-ix-iy})^2 = 4i_x T_x (B_x + i_y T_y \sin\alpha) \end{cases}$$

from which sin α is immediately derived.

For determining the angles θ and γ that characterise the direction of $\vec{e}_z$ in the orthonormed reference frame $(\vec{u}_x, \vec{u}_y, \vec{u}_z)$, conjoint measurements are necessary. The following two four-state sequences $\{i_x+i_{z/2}; -i_x+i_{z/2}; -i_x-i_{z/2}; +i_x-i_{z/2}\}$ and $\{i_y+i_{z/2}; -i_y+i_{z/2}; -i_y-i_{z/2}; +i_y-i_{z/2}\}$ are then successively effected, according to notations similar to those above. The currents $i_x$, $i_y$ and $i_z$ will be chosen so that the modulus of the fields that they create is approximately 50 µT, giving $i_x$, $i_y$ close to 80% of the currents supplied during the phases of calibration of the transfer functions of the coils (6, 7 and 8) and $i_{z/2}$ close to 40% of this value.

The following systems of equations are then obtained:

$$\begin{cases} (B_{ix+iz/2})^2 - (B_{-ix+iz/2})^2 = 4i_x T_x (B_x + \Theta * i_z T_z) \\ (B_{ix-iz/2})^2 - (B_{-ix-iz/2})^2 = 4i_x T_x (B_x - \Theta * i_z T_z) \end{cases} \quad (I)$$

$$\begin{cases} (B_{iy+iz/2})^2 - (B_{-iy+iz/2})^2 = 4i_y T_y \{\cos\alpha[B_y + \Gamma * i_z T_z] - \\ \qquad\qquad\qquad\qquad\qquad \sin\alpha[B_x + \Theta * i_z T_z]\} \\ (B_{iy-iz/2})^2 - (B_{-iy-iz/2})^2 = 4i_y T_y \{\cos\alpha[B_y - \Gamma * i_z T_z] - \\ \qquad\qquad\qquad\qquad\qquad \sin\alpha[B_x - \Theta * i_z T_z]\} \end{cases} \quad (II)$$

where $$\Theta = \frac{\tan\theta}{2\sqrt{1 + \tan^2\theta + \tan^2\gamma}} \text{ and } \Gamma = \frac{\tan\gamma}{2\sqrt{1 + \tan^2\theta + \tan^2\gamma}}$$

Θ and Γ and then θ and γ are then successively derived, which closes the calibration phase.

In a similar manner to the above, the component of the local magnetic field that is orthogonal to the magnetic field generated for the coils is ignored or compensated for, and the radio-frequency field is orthogonal to this field (it may be applied by the third coil, here 8, of axis $\vec{e}_z$).

The invention thus makes it possible to mitigate the drifts in the transfer functions of atomic instruments and to calibrate the coils of these instruments in a weak magnetic field $$\left( B < \frac{2\pi \cdot f_R}{\gamma} \right)$$

in which the scalar measurements are not possible if the relaxation frequency time $f_R$ of the spins is greater than the Larmor frequency f $$\left(f = B \cdot \frac{\gamma}{2\pi} \text{ and } \frac{\gamma}{2\pi} = 28.04 \text{ Hz}/\mu T \text{ for helium 4}\right).$$

The invention makes it possible not to use any additional instrument and to obtain the reference measurement as close as possible to the instrument to be calibrated. It thus improves the quality of the calibration. It makes it possible to use atomic instruments as a magnetometer since, in addition to the estimation of the current transfer function on a field of the coil in question, a measurement of the value of the component $B_x$, $B_y$ or $B_z$ of the local field in this direction is also obtained.

The method can be applied to gases of the alkaline or helium type. The polarisation of the light and the detection method must be adapted to the direction of the magnetic field imposed by the coils. It should be noted that the method can also be applied in circular polarisation provided that they have alternately, according to the direction of the magnetic field, different operating modes of the magnetometers in order to guarantee magnetic measurement conditions in accordance with table II given below. Finally, the invention makes it possible not to be dependent on the amplitude or direction of the ambient magnetic field.

The method has up until now been explained for an apparatus immersed in a relatively strong ambient magnetic field ($B_{x,y,z} \neq 0$ in the equations). It is simplified if the field is negligible or zero, stopped by shielding or compensated for by one of the methods indicated above. It is then possible to consider that $B_{x,y,z} \approx 0$, and then a single current (for example $i_x$ or $-i_x$, instead of $i_x$ and $-i_x$) suffices to determine the gain coefficient ($T_x$) of the associated coil, here (6), by simply solving an equation, such as $B_{+ix} = i_x T_x$, instead of a system with a pair of equations. Likewise, the angles between coils can be determined by single equations instead of pairs of equations. For example, $(B_{ix+iy})^2 - (B_{-ix+iy})^2 = 4_{ix} T_x (-i_y T_y - i_x)$ suffices to give $\alpha$, that is to say it suffices to inject a current ($i_y$) into one of the coils and two currents ($i_x$, $-i_x$) in the other one of the coils, according to two combination states ($i_x i_y$; $-i_x i_y$). The same remarks apply to the determinations of $\theta$ and $\gamma$.

Table I establishes various techniques that can be used for each functional block.

TABLE I

| Flow of polarised photons | Gas/ Spins | Means of generating a magnetic field | Detection | Controls | Measurement/ control of magnetic field |
|---|---|---|---|---|---|
| Laser diode + polariser | He⁴ (a helium plasma must be created) | Generated by one coil, at least | Photo-detector | Digital signal processor | Scalar, via the Larmor frequency |
| Lamp + polariser | Alkaline gas (Cs, Rb, K, etc) | | | Computer | Vectorial, via a zero magnetic field control |
| VCSEL + polariser | | | | Micro-processor | Vectorial, via the Larmor frequency |

The first line of this table corresponds in reality to the example described before. The laser (1) may be a diode of the InGaAs type with a wavelength of 1083 nm and a power of 1 mW. The cell (4) is filled with He⁴ at 1 torr. It is cylindrical, made from Pyrex, and has volume of 10 cm³. Two electrodes are placed up against it and are connected to the generator (9) creating the helium plasma; the radio-frequency waves are around 25 MHz in frequency and 100 mW in power. The vectorial coils (6, 7 and 8) also produce two magnetic fields at low frequency $H_\Omega \cos \Omega t$ and $H_\omega \cos \omega t$ where $$\frac{\Omega}{2\pi} = 3 \text{ kHz},$$

$B_\Omega = 50$ nT, $$\frac{\omega}{2\pi} = 20 \text{ kHz},$$

$B_\omega = 1000$ nT, as well as the compensation fields for the ambient magnetic field B. Finally, the coils (6, 7 and 8) also produce the radio-frequency magnetic field at the Larmor frequency, which induces the magnetic resonance in the gaseous medium subjected to optical pumping. The exact frequency depends on the amplitude of the magnetic field to be measured $$\left(f = B \cdot \frac{\gamma}{2\pi}\right)$$

where f is the frequency of the radio-frequency field and $$\frac{\gamma}{2\pi} = 28.04$$

Hz/nT as seen).

Table II indicates four techniques, known by the names $M_x$, $M_z$, Bell & Bloom and CPT in the art, which also make it possible to exploit the invention with a circular polarisation of light.

| Technique | $M_x$ | $M_z$ | Bell & Bloom | CPT |
|---|---|---|---|---|
| Angle between static magnetic field and direction of laser | 45° | 0° | 90° | 0° |
| Radio-frequency magnetic field | Angle of 90° with the laser and static magnetic field | Angle of 90° with the laser and static magnetic field | Absent | Absent |
| Comment | | | Laser intensity modulation | Laser intensity modulation |

The invention claimed is:

1. A method of calibrating a measurement apparatus with optical pumping functioning, said method comprising:
   successive injection of at least one current for each of three electromagnetic coils each generating a magnetic field axial to a cell filled with a measuring medium;
   measuring the magnetic field generated by each of the coils;

determining a gain coefficient for each coil, which is a ratio between the magnetic field generated and the current injected;

grouping the coils in pairs;

simultaneous injection of currents in the coils in each pair of coils, including two currents in one of the coils in the pair and at least one current in the other coil in the pair, in accordance with at least two different states of combination of said currents;

measuring the magnetic fields generated by said combinations of currents, an ambient magnetic field being ignored, stopped by shielding or compensated for; and determining at least one angle between the coils according to the magnetic fields measured, the gain coefficients and the currents injected.

2. The method according to claim 1, comprising a step of successive injection of two currents of different values and a step of subtracting two corresponding measurements of magnetic fields colinear with the coil.

3. The method according to claim 1 or 2, in which a step of compensating for the ambient magnetic field comprises the following steps:

generation of two orthogonal oscillating fields in order to adjust for direction and intensity the field generated by each of the coils;

generation of a essentially static magnetic field by each of the coils;

compensation for the ambient field by said essentially static field by adjusting the essentially static magnetic field generated for each of the coils.

4. The method according to claim 1, in which there is provided a step of successive repetition of measurements of the magnetic field generated by each coil.

5. The method according to claim 1, wherein the magnetic fields are measured by an application of radio frequency and a search for a resonance of the measuring medium linked to a Larmor frequency.

6. A method of calibrating a measuring apparatus with optical pumping functioning, said method comprising:

successive injection of at least one current for each of three electromagnetic coils each generating a magnetic field axial to a cell filled with a measuring medium;

measuring the magnetic field generated by each of the coils;

determining a gain coefficient for each coil, which is a ratio between the magnetic field generated and the current injected by a successive injection of two currents for each coil;

grouping the coils in pairs;

simultaneous injection of currents in the coils in each pair of coils, including two currents in one of the coils in the pair, in accordance with at least four different states of combination of said currents;

measuring the magnetic fields generated by said combinations of currents; and determining at least one angle between the coils according to the magnetic fields measured, the gain coefficients and the currents injected.

7. The method according to claim 6, in which there is provided a step of successive repetition of measurements of the magnetic field generated by each coil.

8. The method according to claim 6, wherein the magnetic fields are measured by an application of radio frequency and a search for a resonance of the measuring medium linked to a Larmor frequency.

* * * * *